(12) United States Patent  
Brouillette et al.

(10) Patent No.: US 7,070,087 B2  
(45) Date of Patent: Jul. 4, 2006

(54) METHOD AND APPARATUS FOR TRANSFERRING SOLDER BUMPS

(75) Inventors: Guy Brouillette, Canton de Shefford (CA); David Danovitch, Canton de Granby (CA); Jean-Paul Henry, Sutton (CA)

(73) Assignee: International Business Machines Corporation, Armonk, NY (US)

( * ) Notice: Subject to any disclaimer, the term of this patent is extended or adjusted under 35 U.S.C. 154(b) by 237 days.

(21) Appl. No.: 10/707,293

(22) Filed: Dec. 3, 2003

(65) Prior Publication Data

US 2004/0214420 A1   Oct. 28, 2004

(30) Foreign Application Priority Data

Apr. 28, 2003   (CA) .................................... 2426651

(51) Int. Cl.
- B23K 35/12   (2006.01)
- B23K 31/02   (2006.01)
- B23K 37/06   (2006.01)
- B23K 1/00    (2006.01)

(52) U.S. Cl. .................. 228/246; 228/33; 228/39; 228/41; 228/180.22; 228/248.1

(58) Field of Classification Search .............. None
See application file for complete search history.

(56) References Cited

U.S. PATENT DOCUMENTS

| | | | | |
|---|---|---|---|---|
| 4,412,642 A | * | 11/1983 | Fisher, Jr. | 228/173.1 |
| 5,381,848 A | * | 1/1995 | Trabucco | 164/102 |
| 5,718,367 A | * | 2/1998 | Covell | 228/254 |
| 6,003,757 A | * | 12/1999 | Beaumont et al. | 228/246 |
| 6,153,505 A | * | 11/2000 | Bolde et al. | 438/613 |
| 6,394,334 B1 | * | 5/2002 | Brouillette et al. | 228/33 |
| 6,708,872 B1 | * | 3/2004 | Gruber et al. | 228/248.1 |

FOREIGN PATENT DOCUMENTS

DE            3623031 A   *   1/1988

* cited by examiner

Primary Examiner—Lynne R. Edmondson  
(74) Attorney, Agent, or Firm—Michael J. LeStrange; Anthony J. Canale

(57) ABSTRACT

The present invention relates to improvements in forming and transferring solder bumps for use in mounting integrated circuit substrates on chip carrier packages. A mold having cavities for the solder bumps is held in contact with a substrate and a compressible device. As the temperature is increased to melt the solder in the cavities, at an appropriate time and temperature, the compressible device is caused to decompress resulting in the mold separating from the substrate and leaving formed solder bumps on the contacts on the substrate. Various mechanisms are described to cause the force holding the mold and substrate together to decrease.

16 Claims, 5 Drawing Sheets

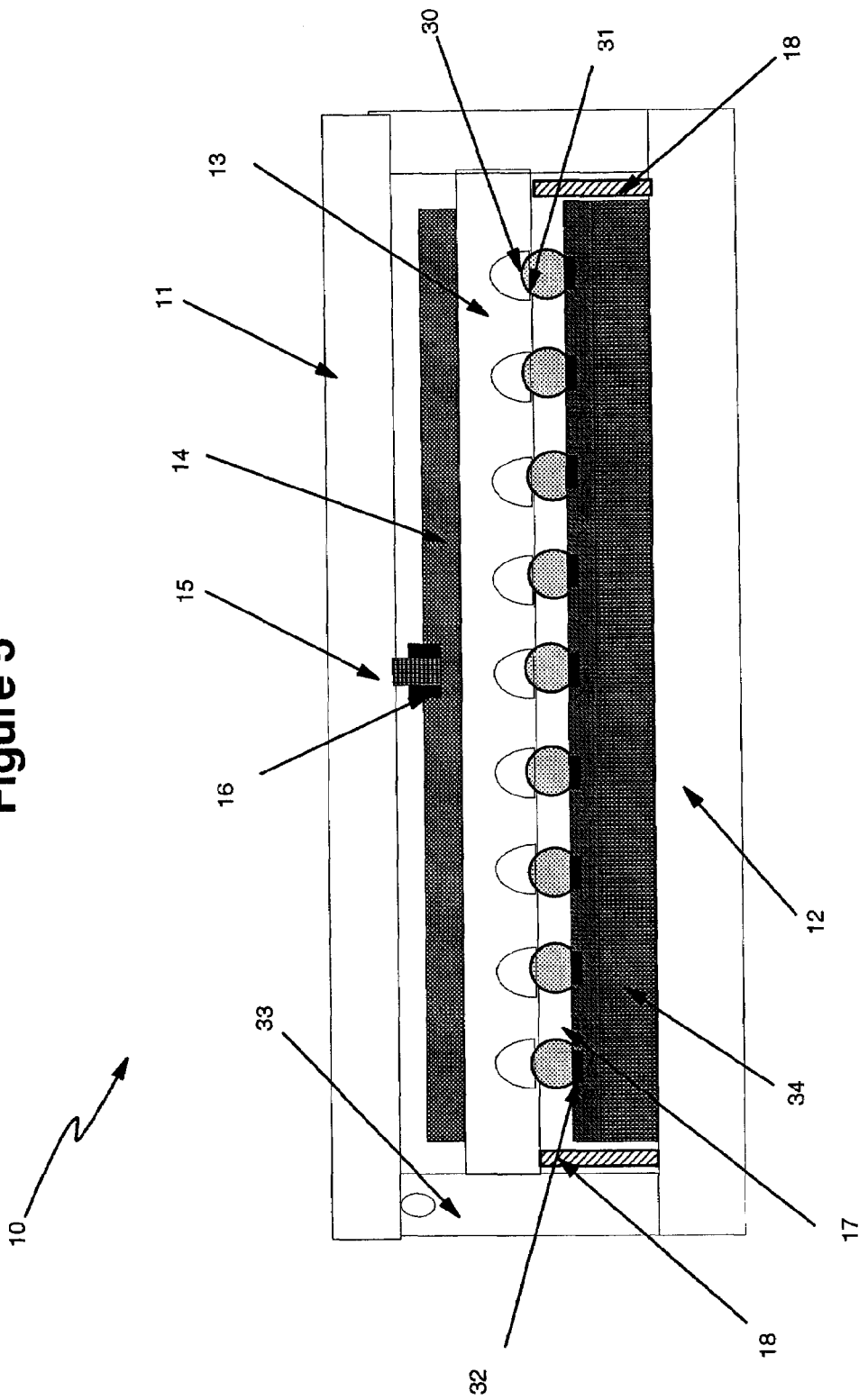

METHOD AND APPARATUS FOR TRANSFERRING SOLDER BUMPS

BACKGROUND OF INVENTION

1. Field of the Invention

This invention relates to electronic packages for integrated circuits, including methods and apparatus related to manufacturing, and in particular, electronic chip carrier packages with solder bump electrical connections between chip substrate pads and the chip carrier package.

2. Background of the Invention

Current manufacturing techniques utilize two primary methods for coupling integrated circuit chip substrates to chip carrier packages. The first is wire bonding, whereby each of the I/O pad terminals on a chip substrate is sequentially wired to corresponding pads on a chip carrier package. The second method is flip chip attachment (FCA) in which all the I/O pads on a chip are first terminated with a solder material. The chip is then flipped over and the solder bumps are aligned and reflowed in a reflow furnace to facilitate all of the I/O connections with bonding pads on the chip carrier package. An advantage achieved by the flip chip process is its suitability to high I/O density and greater reliability of the interconnections—formed as compared to wire bonding processes.

There are a variety of methods presently used to form solder bumps on a chip substrate. Often, the formation of solder bumps is carried out by a method of evaporating lead and tin mixtures through a mask for producing the desired configuration of solder bumps on the chip substrate. Techniques of electrodeposition of such mixtures have also been used to produce solder balls in flip chip packaging.

Another popular technique is the process of solder paste screening. However, the continued evolution of integrated circuit manufacturing processes toward progressively higher density circuits necessitates a correspondingly higher I/O pad density and tighter pitch constraints for pad terminals. For current processes, it is not unusual for a design to contain more than 1000 I/O pads. As a result, the solder paste screening technique becomes less practical to implement. Moreover, since the solder paste is normally applied directly to the substrates through a screen mask which contains holes aligned to the paste receiving pads on the substrate, any problems occurring during the process may also result in substantial rework of the substrate, thereby increasing the probability of damage to the substrate and significantly impacting manufacturing throughput.

A more recently developed injection molded solder technique dispenses molten solder instead of solder paste. An advantage of this process results from very little volume change occurring between the molten solder and the resulting solder bump. This process is typically practiced by first filling with solder a mold containing holes or cavities aligned to the pads on the substrate. Next, the filled mold is placed in close proximity to a substrate which contains solder receiving pads and onto which flux material has typically been dispensed in a thin layer over the substrate. When the solder in the mold is heated to a melting temperature in a furnace, surface tension reduction causes the solder to ball up and intimately contact the solder receiving pad, which is normally covered with gold or other solder wetting alloy. A wiper may be used after the molten solder fills the holes to remove excess solder. However, when this technique is used on large substrates, the balling up of the solder may be insufficient to ensure intimate contact between the solder in the mold cavities and solder receiving pads on the substrate and thus the solder balls may not adequately adhere to the substrate contact pads.

One prior art technique for overcoming the difficulties of known processes in forming solder bumps for integrated circuit to package interconnections is described in U.S. Pat. No. 6,003,757 entitled "Apparatus for Transferring Solder Bumps and Method of Using," issued Dec. 21, 1999 and commonly assigned to International Business Machines Corporation. This patent describes a method and apparatus to maintain a solder mold in intimate contact with the solder receiving substrate, for example a semiconductor wafer, during a solder reflow operation such that the solder in the mold is transferred to solder wettable pads on the receiving substrate. A uniform pressure on the mold substrate assembly is necessary to ensure that all solder segments from the mold cavities are able to contact all solder wettable pads on the substrate at the time that the solder becomes molten. As described in U.S. Pat. No. 6,003,757, the apparatus applies such a uniform pressure until physical disassembly by human intervention as when opening the lid of the clamshell assembly of the apparatus releases the pressure. Such human intervention must occur after the mold-substrate assembly has exited the reflow furnace and cooled. Due to the pressure, the molten solder has maintained the shape of the mold cavity in which it was located and in effect, is somewhat adhering to most or all of the mold cavity surfaces. Although this is not a metallurgical bond in the sense of the solder-substrate pad interface, which is a strong metallurgical bond, separating the mold from the cavity nonetheless requires a certain tensile force and care must be taken to avoid any shearing motion. Both of these latter conditions risk unintended separation of the metallurgical bond between the solder and substrate pad. To reduce such risk, the mold-substrate assembly is subjected to a second solder reflow operation after the uniform pressure has been physically released. At this stage without any compressive forces present and with gravitational forces minimized by orienting the assembly such that the lighter substrate is on top, the remelted solder, now metallurgically bonded to the substrate pad, will tend to partially ball up, thus forcing the mold and the substrate to partially separate and facilitate physical separation of the two. Once successfully separated, it is often desired to have perfectly rounded solder bumps on the substrate in order to optimize subsequent assembly operations, suggesting yet another solder reflow operation of the substrate alone.

SUMMARY OF INVENTION

The present invention relates to reducing the difficulties in forming and transferring uniform solder bumps from a grid array solder mold containing individual solder elements to an integrated circuit substrate. The present invention provides techniques to alleviate the above described deficiencies and drawbacks in the prior art.

The apparatus and method of the present invention provides for the removal of intimate contact between the mold and the substrate at a prescribed point in the process during the reflow operation. By doing so, the transfer of solder from a mold to solder wettable substrate pads of a substrate, the separation of mold from the substrate and the uniform balling shape of the transferred solder bumps on the substrate, can be accomplished by a single solder reflow process instead of two or three as may be required in the prior art.

According to one aspect of the present invention, a method is provided of transferring solder bumps from a mold to a substrate having a plurality of pads by providing a base member and a substrate located thereon and positioning a mold having a plurality of solder elements on said substrate such that each solder element contacts a corresponding pad on the substrate and the mold contacts at least one compressible device located on the base member. The mold is caused to compress the compressible device and the solder elements are heated such that each solder element melts and metallurgically bonds to a corresponding substrate pad. The compressible device is caused to decompress and thereby separate the substrate and the mold while the solder elements are still molten. As the solder cools and hardens, each solder element remains on its corresponding substrate pad and forms a semi-spherical solder bump.

According to another aspect of the present invention, an apparatus is provided for transferring solder bumps from a mold to a substrate having a plurality of pads where the apparatus has a base member and a substrate located thereon. A mold having a plurality of solder elements is positioned on the substrate such that each solder element contacts a corresponding pad on the substrate and the mold contacts a compressible device located on the base member. A compressive force is applied to the mold causing the compressible device to contract. A reflow heating element melts the solder elements and causes each of the solder elements to transfer to a corresponding pad. A compressive force is applied to the mold thereby decompressing the compressible device and causing the substrate and mold to separate while the solder elements are molten resulting in each solder element remaining on a corresponding substrate pad in the form of a semi-spherical solder bump.

BRIEF DESCRIPTION OF DRAWINGS

The above and other advantages of the present invention will be better understood with reference to the following drawings wherein like reference numbers represent like elements of the invention embodiments:

FIG. 5 shows the positioning of elements as in FIGS. 3 and 4 wherein the mold has been separated from the substrate.

DETAILED DESCRIPTION

The preferred embodiments of the present invention disclose methods and apparatus that provide for opposing forces to occur within a transfer assembly to thereby enhance the transfer of solder bumps from a mold to a substrate. A backing plate and lid member of the transfer fixture continue to provide a compressive force to a mold and substrate assembly while a base member is provided with compressible devices forced against the mold outside of the interface area between the mold and substrate. While the compressive forces imparted by the backing plate and lid member exceed the decompressing forces of the compressible devices, the mold and substrate remain in contact with each other. As soon as the compressive forces resulting from the backing plate and lid member are eliminated or sufficiently reduced, the decompression of the compressible devices results in the mold moving upward and away from the substrate. In order to achieve the advantages of the subject invention, in a preferred embodiment, a thermally ductile buffer is provided to eliminate or sufficiently reduce the forces applied to the lid member and backing plate while the mold, substrate assembly and transfer fixture mechanism are still in a reflow furnace and the solder bumps to be transferred are still in a molten state.

Figure 1:
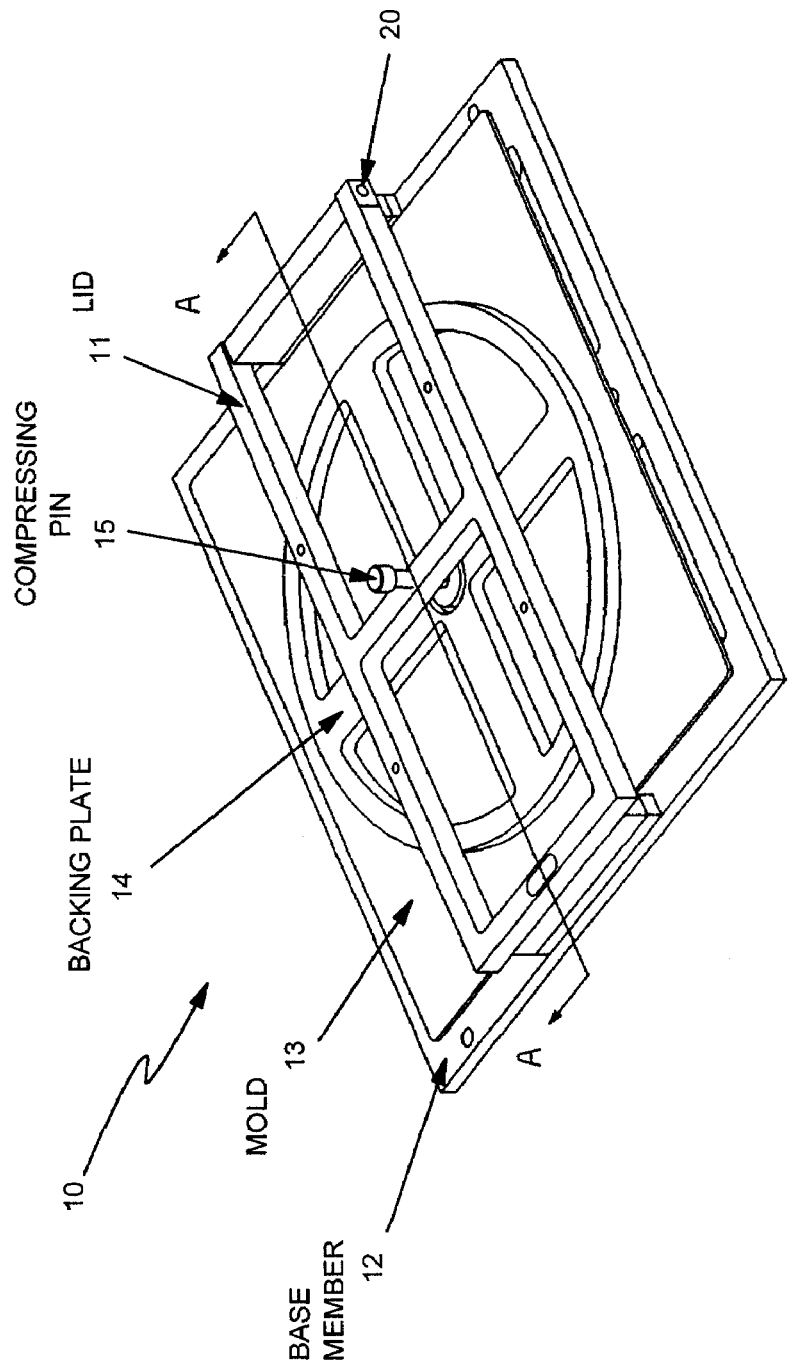
FIG. 1 illustrates an isometric drawing of a transfer fixture apparatus for mounting and holding a substrate wafer or similar object to which solder bumps are transferred in accordance with a preferred embodiment of the present invention.

FIG. 1 is a perspective view of transfer fixture 10 for implementing a preferred embodiment of the present invention. Fixture 10 comprises a moveable lid 11 attached to base member 12, with hinge 20. Lid 11 may be of any appropriate design and shape and as shown in FIG. 1, lid 11 in the shape of the letter "H" is suitable. A compressing pin 15 is attached to lid 11, which will be described with reference to FIG. 2. Mold 13 overlays a substrate or wafer on which solder bumps are to be formed. The solder bumps are transferred and attached to wettable receiving pads on the substrate. The wafer or substrate is not readily shown in FIG. 1 but will be apparent and further described with reference to subsequent drawing figures. Backing plate 14 is configured to uniformly exert pressure on mold 13. Any appropriate design of backing plate 14 may be employed as long as substantially uniform pressure is applied to mold 13. The pressure is initiated by forces resulting from compressing pin 15 which applies pressure to backing plate 14 through a thermally ductile buffer 16 which may be physically altered by the application of heat. In the preferred embodiment of the invention, the thermally ductile buffer 16 may be a slug of solid solder with a higher melting temperature than the solder used to form the solder bumps on the substrate.

Figure 2:
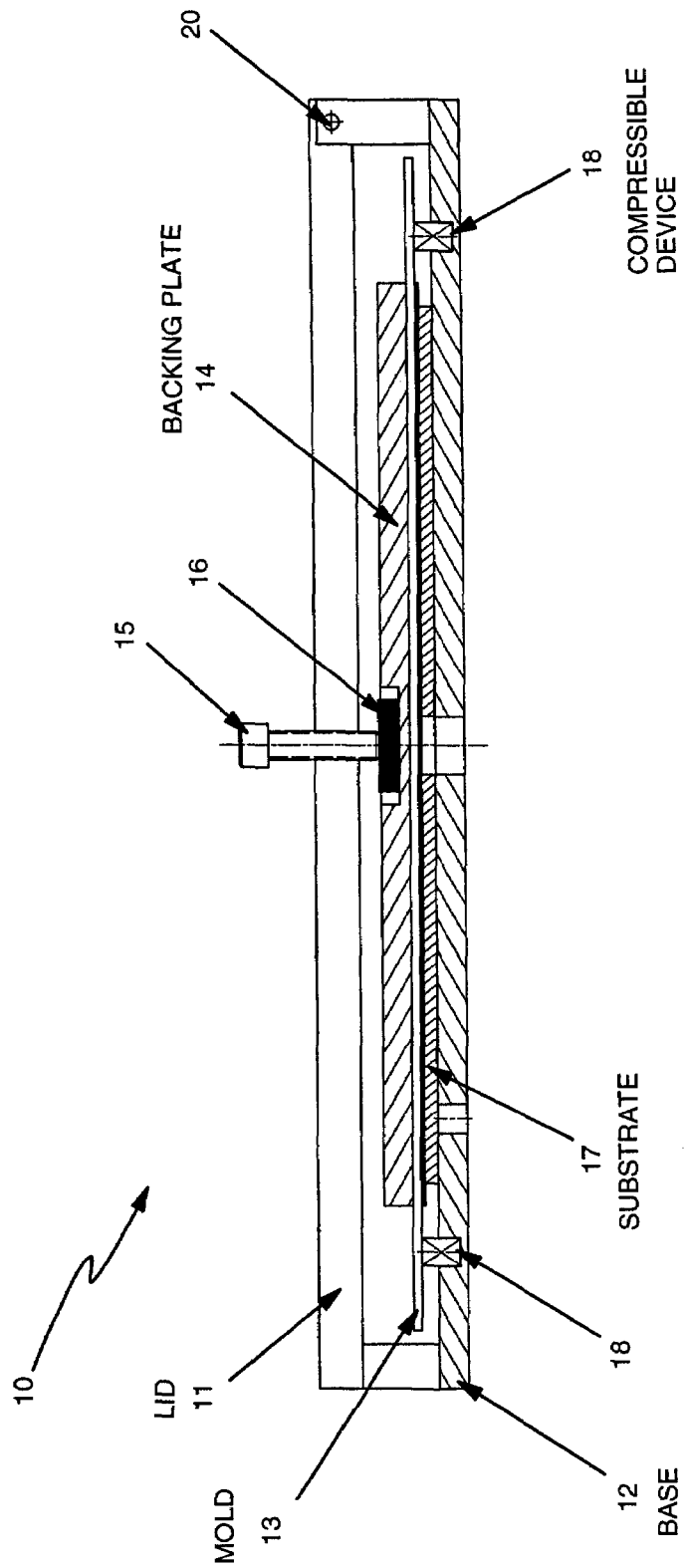
FIG. 2 shows a cross-sectional view of the apparatus shown in FIG. 1 as indicated by the arrows A—A, showing more details of the compressible devices of the transfer fixture apparatus and the mechanisms to compress and decompress the compressible devices, according to a preferred embodiment of the present invention.

FIG. 2 illustrates a cross-sectional view of the preferred transfer fixture of FIG. 1. Substrate 17 is placed on base member 12 over which mold 13 is positioned. Mold 13 is shown abutting against compressible devices 18. Compressible device 18 includes one or more devices suitably positioned between mold 13 and base 12 of fixture 10. Compressible device 18 could be, for example, a spring. When force is applied to compressing pin 15, mold 13 contacts substrate 17 and compressible device 18 is compressed. Mold 13 has a plurality of cavities in which solder elements have been placed and these solder elements in turn contact pads on the surface of substrate 17. As shown in FIG. 2, when lid 11 is closed against base 12, compressing pin 15 is forced against solder slug 16, which in turn causes pressure to be applied to backing plate 14 and mold 13, thereby compressing compressible devices 18.

Compressing pin 15 is preferably implemented with a spring-loaded pin. An interference fit is designed between pin 15 and lid 11. When lid 11 is closed against base member 12, a force is transmitted from pin 15 to subsequent elements below pin 15, namely solder slug 16, backing plate 14, mold 13, substrate 17 and base member 12. The interference fit will cause spring-loaded pin 15 to compress thereby exerting a force against slug 16 and in turn against backing plate 14 and against mold 13 which causes compressible devices 18 between mold 13 and base 12 to compress.

Compressing pin 15 and compressible devices 18 are designed to provide sufficient compressive forces to ensure adhesion of the solder bumps to the wetted surface of the substrate pads. Material selection of backing plate 14 is such that it is non-wettable to the solder of solder slug 16. Fixture 10 also comprises an appropriate mechanical device (not shown), vacuum or otherwise, to hold substrate 17 against base 12, such that during separation of mold 13 from substrate 17, the surface tension forces of the molten solder between said mold 13 and said substrate 17 are overcome and substrate 17 remains on base 12.

In summary, with reference to FIGS. 1 and 2, lid 11 contains compressing pin 15 which abuts against backing plate 14 by means of a slug of solid solder 16 between pin 15 and backing plate 14. Backing plate 14 in turn abuts against the top side of the assembly of mold 13 and substrate 17. Thermally ductile solid solder element or slug 16 is made of a material with a higher melting point than the solder elements used in cavities of mold 13 yet a lower melting point than the peak temperature that is achieved in the reflow temperature profile as appropriately selected for the solder elements in mold 13. Thus, solder slug 16 will only melt after the solder elements in mold 13 to be transferred have melted and wetted the solder wettable pads of substrate 17. When solder slug 16 melts, it can no longer act as a solid interface between compressing pin 15 and backing plate 14 and hence backing plate 14 no longer exerts a significant compressive force against the assembly of mold 13 and substrate 17. At this point, compressive device or devices 18 located between base member 12 and mold 13 will force mold 13 upward, thus separating mold 13 from substrate 17. However, substrate 17 is held in place on base member 12 for a sufficient length of time whereby the transferred solder balls have wetted the pads on substrate 17 and are still molten. When the cavities of mold 13 no longer restrict the shape of the transferred solder bumps, the solder bumps are free to revert to their lowest energy shape which tend towards spherical. The shape is determined by the existence of metallurgical bonds between each one of the solder bumps and a solder wettable pad on substrate 17 upon which the solder bump is affixed.

Examples of selections for the solder alloy constituting solder slug 16 will now be described. If the solder bumps to be transferred to substrate 17 are made of eutectic tin/lead (63% Sn, 37% Pb) with a melting point of 183 degrees C., typical solder reflow profiles may have a maximum peak temperature of 215 to 230 degrees C. For the purpose of this example, the average peak reflow temperature is assumed to be 225 degrees C. Accordingly, one possible alloy for solder slug 16 is $Sn_{3.5}Ag_{0.7}Cu$ (hereinafter referred to as SAC), which melts at 217 degrees C. When the solder reflow temperature profile reaches 183 degrees C., the solder bumps will start to melt and wet the corresponding pads on substrate 17. As the solder reflow temperature profile reaches 217 degrees, the SAC solder slug 16 will melt. This releases or decreases the compressive forces between pin 15 and backing plate 14 and therefore mold 13. Compressible devices 18 between base member 12 and mold 13 then force mold 13 upward and away from substrate 17 which is being held on base 12. As mold 13 moves away from substrate 17, backing plate 14 is similarly caused to move upward, forcing the liquid SAC solder slug 16 to flow around compressive pin 15. This process continues as the solder reflow temperature profile of the solder bumps rises to a peak of 225 degrees C. and then descends to 217 degrees C. At 217 degrees C., the SAC solder slug 16 solidifies in its position around compressing pin 15 with backing plate 14 and mold 13 still being pushed upward position by the compressible devices 18 on base member 12. The eutectic solder bumps remain molten at 217 degrees C. and are no longer restricted in shape by the cavities of mold 13. Instead, the solder bumps attach to the pads of substrate 17 and tend to ball up into a semi-spherical shape because of their adherence to respective pads on the substrate. The solder bumps will subsequently solidify in this shape as the temperature profile descends below 183 degrees C.

Figure 3:
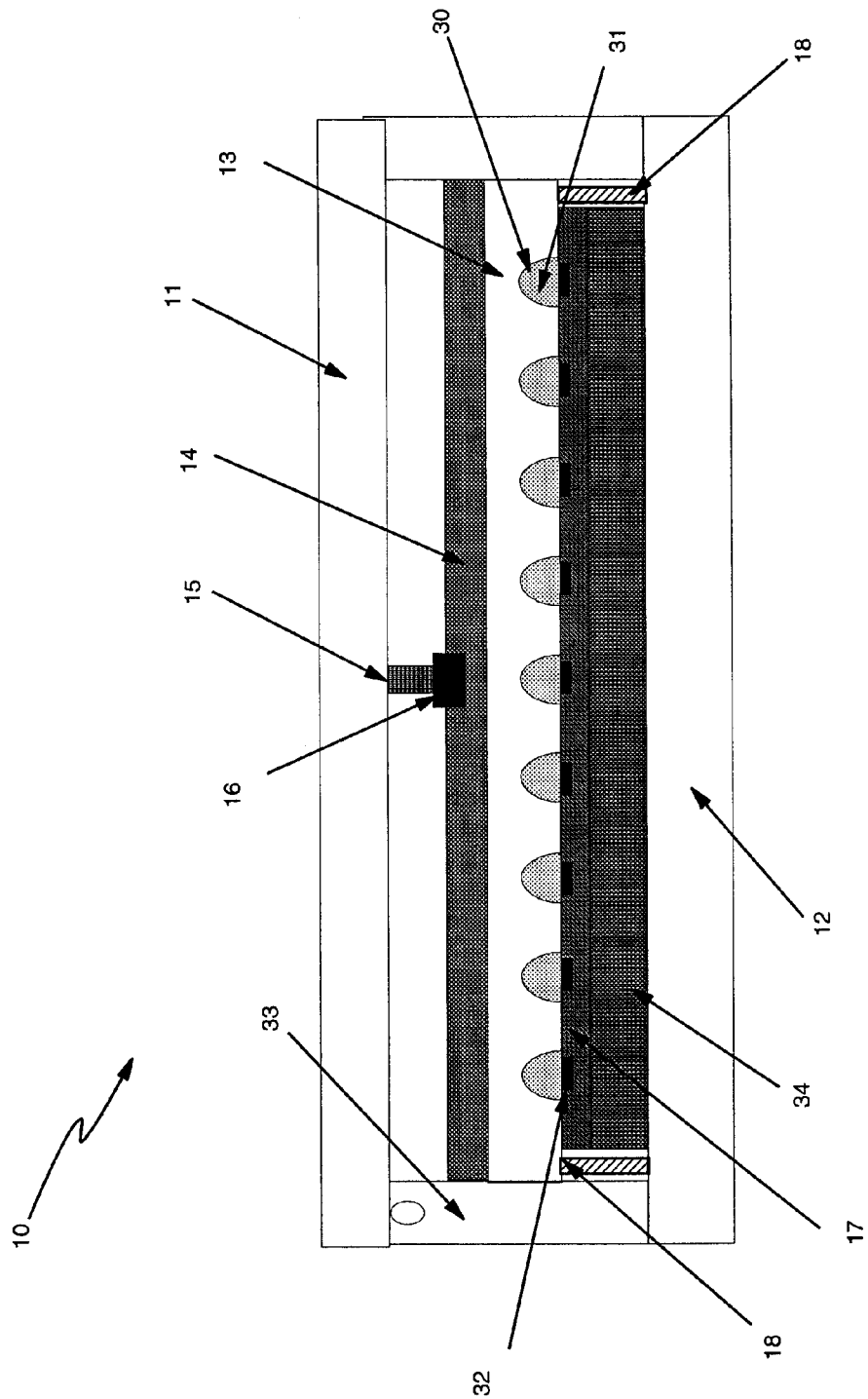
FIG. 3 illustrates the positioning of the elements of a preferred embodiment of the invention prior to heat being applied to melt the solder slug of the transfer fixture apparatus.
Figure 4:
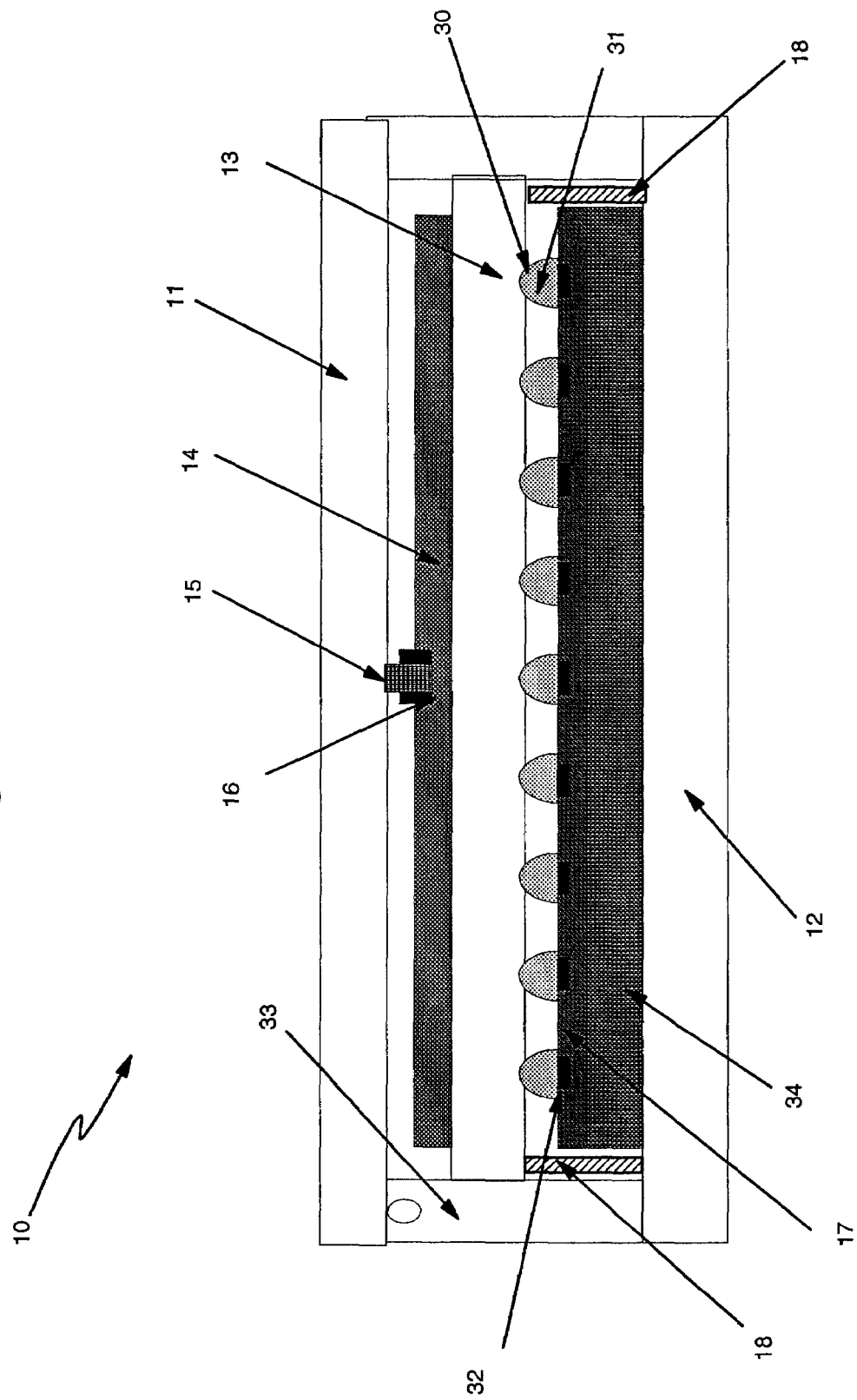
FIG. 4 illustrates the positioning of elements as in FIG. 3 wherein the temperature has been raised to cause the solder slug to melt.

FIGS. 3, 4 and 5 illustrate various stages of the formation of the solder bumps. Note that substrate 17 is shown mounted on foam 34 on base 12 in all three figures. Foam 34 is optional in realizing the beneficial results of the invention, but is found to be useful in achieving a more uniform pressure being applied between mold 13 and wafer or substrate 17. In any case, as previously described, substrate 17 is appropriately held against base 12. Mold 13 has a plurality of cavities 30 containing solder elements 31. Substrate 17 has a plurality of solder wettable pads 32 corresponding to each of the cavities 30 of mold 13. FIG. 3 shows the initial position of the various elements of apparatus 10 once lid 11 has been appropriately attached to fixture frame 33 and compressing pin 15 applies pressure to backing plate 14 through solder slug 16. At a temperature range up to 183 degrees C., at which point solder elements 31 begin to melt, solder elements 31 in mold cavities 30 have not yet wet pads 32 on substrate 17. However, as the temperature profile increases, solder elements 31 begin to melt and the temperature rises from 183 degrees C. to 217 degrees C., the arrangement as shown in FIG. 3 continues to exist, but solder elements or bumps 31 in mold cavities 30 have melted and wet the respective pads 32 on substrate 17.

With reference to FIG. 4, the diagrammatic representation of transfer fixture 10 is shown as the temperature rises above 217 degrees C. At this point solder slug 16 melts and begins to flow around compressing pin 15, thereby reducing the compressive forces applied by lid 11 through pin 15 on backing plate 14 and mold 13. This results in backing plate 14 and mold 13 being pushed upward by compression devices 18. As can be seen, compression devices 18 are elongated and decompressed in FIG. 4 when compared with the illustration in FIG. 3.

With reference to FIG. 5, the diagrammatic representation of fixture 10 is shown at the temperature between 217 degrees C. and 225 degrees C. Solder bumps 31 are no longer restrained by cavities 30 in mold 13 but are wetted to pads 32 on substrate 17 and begin to ball up as shown. Once fixture 10 is removed from the reflow furnace and the temperature profile is allowed to descend below 183 degrees C., solder bumps 31 will solidify while remaining attached to pads 32 on substrate 17. Solder bumps 31 will cure and harden in the spherical configuration shown in FIG. 5.

Other methods and structures could be used to achieve similarly intended results of eliminating and reducing the compressive forces applied by lid 11 in fixture 10 at the appropriate time where solder elements 31 from mold 13 have transferred to pads 32 on substrate 17 while they are still in a molten state. These alternative embodiments would be apparent to one of ordinary skill in this art. For example, a spring mechanism for imparting compressive forces on backing plate 14 resulting from compressing pin 15 could be designed to diminish the applied forces at a prescribed time, where the time is correlated to the time dependent temperature profile of the reflow furnace. Alternatively, the release or decrease of the applied force could be affected at a prescribed temperature by the use of a temperature sensor. In addition, the spring mechanism could be made of a material that has a temperature-dependent spring constant such that at the desired temperature the spring constant is sufficiently low that the compressing pin 15 exerts little or no compressive force on backing plate 14 and mold 13, permitting the compressible devices 18 to decompress and move mold 13 away from substrate 17 as described above.

While the invention has been described in detail, the foregoing description is in all aspects illustrative and not restrictive. It is understood that numerous other modifications and variations can be devised without departing from the scope of the invention. The scope of the invention should be limited only by the language of the claims which follow.

What is claimed is:

1. A method of transferring solder bumps from a mold to a substrate having a plurality of pads comprising the steps of:
   providing a base member and a substrate located thereon;
   positioning a mold having a plurality of solder elements on said substrate such that each said solder element contacts a corresponding substrate pad and said mold contacts at least one compressible device having a thermally ductile buffer and located on said base member;
   causing said mold to compress said compressible device;
   heating said solder elements such that each said solder element melts and adheres to said corresponding substrate pad; and
   causing said compressible device to decompress and thereby separate said substrate and said mold while the solder elements remain in a molten state thereby causing each said solder element to adhere to said corresponding substrate pad in the form of a solder bump.

2. The method according to claim 1 further comprising the steps of:
   allowing said solder bumps to solidify on said substrate pads.

3. The method according to claim 1 further comprising the steps of:
   positioning a backing plate on said mold; and
   applying a force to said backing plate causing said mold to compress the compressible device.

4. The method according to claim 3 further comprising the steps of:
   placing said thermally ductile buffer on said backing plate; and
   applying said force applied to the backing plate through the thermally ductile buffer.

5. The method according to claim 4, wherein said step of causing said compressible device to decompress results from applying heat to cause said thermally ductile buffer to change shape resulting in a decrease in the force applied to the backing plate.

6. The method according to claim 5, wherein said thermally ductile buffer comprises a solder and changes shape with applied heat.

7. The method according to claim 5, wherein said thermally ductile buffer comprises a spring which changes shape with applied heat resulting in a decrease in the force applied to the backing plate.

8. The method according to claim 1, wherein said mold contacts a plurality of compressible devices located on said base member.

9. The method according to claim 1, wherein said mold has a plurality of cavities each containing said solder element.

10. An apparatus for transferring solder humps from a mold to a substrate having a plurality of pads comprising:
    a base member and a substrate located thereon;
    a mold having a plurality of solder elements and positioned on said substrate such that each said solder element contacts a corresponding substrate and said mold contacts a compressible device located on said base member,
    a first device coupled to said mold for enabling the application of a compressive force to said compressible device;
    a first reflow heating element for melting said solder elements and causing each said solder element to transfer from said mold to said corresponding substrate pad; and
    a second device coupled to a thermally ductile buffer for causing said substrate and said mold to separate while said solder elements are melted, resulting in each said solder element adhering to a corresponding pad in the form of a solder bump.

11. The apparatus according to claim 10, wherein: said first device coupled to said mold comprises a backing plate.

12. The apparatus according to claim 11, wherein: said second device coupled to said mold comprises said reflow heating element to enable said thermally ductile buffer to change shape causing a reduction of force applied to said backing plate and resulting in the decompression of said compressible device and the separation of said substrate and said mold while said solder elements are molten.

13. The apparatus according to claim 12, wherein said thermally ductile buffer comprises a solder and changes shape with heat applied from said reflow heating element.

14. The apparatus according to claim 12, wherein said thermally ductile buffer comprises a spring which changes shape with heat applied from said reflow heating element resulting in a reduction of the force applied to said backing plate.

15. The apparatus according to claim 10, wherein said mold contacts a plurality of compressible devices located on said base member.

16. The apparatus according to claim 10, wherein said mold has a plurality of cavities each containing said solder element.

* * * * *